(12) United States Patent
Fujita et al.

(10) Patent No.: US 8,415,685 B2
(45) Date of Patent: Apr. 9, 2013

(54) LIGHT-EMITTING ELEMENT, LIGHT-EMITTING APPARATUS, DISPLAY, AND ELECTRONIC DEVICE

(75) Inventors: Tetsuji Fujita, Chino (JP); Hidetoshi Yamamoto, Suwa (JP); Shinichi Iwata, Chino (JP); Koji Yasukawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 208 days.

(21) Appl. No.: 12/945,391

(22) Filed: Nov. 12, 2010

(65) Prior Publication Data

US 2011/0114929 A1 May 19, 2011

(30) Foreign Application Priority Data

Nov. 18, 2009 (JP) ................................. 2009-263407

(51) Int. Cl.
*H01L 27/15* (2006.01)
*H01L 31/12* (2006.01)
*H01L 33/00* (2010.01)

(52) U.S. Cl.
USPC ........ 257/79; 257/88; 257/288; 257/E21.006; 257/E21.053; 257/E21.361; 257/E21.311; 257/E21.365; 257/E21.366; 257/E21.17

(58) Field of Classification Search ............... 257/79, 257/78, 88, 13, 40, 104, 288, 431, 602, 603, 257/918, E21.006, E21.053, E21.17, E21.311, 257/E21.352, E21.361, E21.366
See application file for complete search history.

(56) References Cited

U.S. PATENT DOCUMENTS

| | | | | |
|---|---|---|---|---|
| 4,720,432 A * | 1/1988 | VanSlyke et al. | ............. | 428/457 |
| 6,344,283 B1 | 2/2002 | Inoue et al. | | |
| 6,798,440 B2 * | 9/2004 | Yasuda | ....................... | 347/244 |
| 7,244,515 B2 * | 7/2007 | Doi et al. | ....................... | 428/690 |
| 7,868,536 B2 * | 1/2011 | Aurongzeb | ................... | 313/503 |
| 7,993,747 B2 * | 8/2011 | Mochizuki et al. | ........... | 428/403 |

FOREIGN PATENT DOCUMENTS

JP  B2-3654909  6/2005

* cited by examiner

*Primary Examiner* — David Nhu
(74) *Attorney, Agent, or Firm* — Oliff & Berridge, PLC

(57) ABSTRACT

A light-emitting element has a cathode, an anode, a light-emitting portion interposed between the cathode and the anode and having a light-emitting layer that emits light on energization between the cathode and the anode, and a hole-injection layer interposed between and in direct contact with the anode and the light-emitting layer and having a capability of receiving holes, and the hole-injection layer is mainly composed of a benzidine derivative.

19 Claims, 6 Drawing Sheets

LIGHT-EMITTING ELEMENT, LIGHT-EMITTING APPARATUS, DISPLAY, AND ELECTRONIC DEVICE

BACKGROUND

1. Technical Field

The present invention relates to a light-emitting element, a light-emitting apparatus, a display, and an electronic device.

2. Related Art

Organic electroluminescence (EL) elements are light-emitting elements each composed of an anode, a cathode, and at least one light-emitting organic layer interposed between them. An electric field is applied between the cathode and the anode, electrons and holes are injected from the cathode and the anode, respectively, to the light-emitting layer where they are coupled once again forming excitons, and then the excitons return to the ground state emitting energy in the form of light.

An example of light-emitting elements is the one disclosed in Japanese Patent No. 3654909, a light-emitting element further having a hole-injection layer and a hole-transport layer interposed between an anode and a light-emitting layer in order for improved injection of holes.

Recently, there has been demand for improved properties of light-emitting elements (e.g., injection of electrons), and thus the elements often contain many layers other than those interposed between an anode and a light-emitting layer. In particular, white light-emitting elements require three light-emitting layers for emitting light in red, blue, and green colors, intermediate layers for balanced and/or long-lasting light emission, and many other layers, necessitating the use of too many layers for each light-emitting element. This problematically increases the driving voltage required to operate light-emitting elements.

The driving voltage requirement for light-emitting elements can be decreased by reducing the total thickness of layers interposed between an anode and a cathode. In a known light-emitting element, however, this allows foreign matter existing on the substrate to contaminate many of the constituent layers, resulting in a defective product with leakage between the anode and the cathode. So, the manufacturing of light-emitting elements has been facing the problem of low yield.

SUMMARY

An advantage of some aspects of the invention is that light-emitting elements, as well as light-emitting apparatuses, displays, and electronic devices equipped therewith, are provided with an improved yield in production, an enhanced luminous efficiency, and a decreased driving voltage requirement.

This and other advantages of some aspects of the invention can be offered by the following constitutions:

A light-emitting element having:
a cathode;
an anode;
a light-emitting portion interposed between the cathode and the anode and having a light-emitting layer that emits light on energization between the cathode and the anode; and
a hole-injection layer interposed between and in direct contact with the anode and the light-emitting layer and having a capability of receiving holes, wherein:
the hole-injection layer is mainly composed of a benzidine derivative.

Since there is only the hole-injection layer between the anode and the light-emitting portion, the number of layers constituting the light-emitting element is small. Therefore, the light-emitting element can be operated with a low driving voltage.

Benzidine derivatives have an excellent performance in receiving and giving holes. Composed mainly of a benzidine derivative, the hole-injection layer allows efficient injection and transport of holes from the anode therethrough to the light-emitting portion. Therefore, the light-emitting element can have a high luminous efficiency.

The excellent performance of benzidine derivatives in receiving and giving holes also allows the hole-injection layer to have an increased thickness. So, during preparation of the light-emitting element, the hole-injection layer can be so formed as to mask (bury) any foreign matter existing on the anode. This increased thickness of the hole-injection layer prevents or reduces contamination by foreign matter over several constituent layers, thereby preventing interlayer short-circuits induced by foreign matter. As a result, the light-emitting element can be manufactured with a good yield.

In the light-emitting element according to an aspect of the invention, the hole-injection layer preferably has an average thickness in the range of 80 to 200 nm. Under this constitution, the light-emitting element can be operated with a low driving voltage in an easy and reliable fashion, and the hole-injection layer can be so formed as to mask any foreign matter existing on the anode.

The distance between the anode and the cathode is preferably in the range of 150 to 300 nm. This constitution also contributes to easy and reliable lowering of the driving voltage requirement.

The anode preferably has its surface on the hole-injection layer side treated with plasma. This constitution improves the performance of the hole-injection layer in receiving holes from the anode.

And, the anode is preferably composed of ITO (indium tin oxide). This constitution allows holes to be injected from the anode to the hole-injection layer with an improved efficiency.

It is also preferable that the light-emitting portion has several light-emitting layers and that the hole-injection layer is interposed between and in direct contact with the anode and the closest light-emitting layer to the anode. With several light-emitting layers in the light-emitting portion, a light-emitting element would often have a great total thickness between its anode and cathode and thus require a high driving voltage to operate. An aspect of the invention is very advantageous to this kind of light-emitting element.

It is also preferable that the light-emitting portion contains first, second, and third light-emitting layers for emitting light in different colors, layered in this order from the anode side to the cathode side and that the hole-injection layer is interposed between and in direct contact with the anode and the first light-emitting layer. This constitution provides a light-emitting element that can produce light in any desired color. For example, a constitution with a first layer for red light, a second layer for blue light, and a third layer for green light provides a white light-emitting element.

The first light-emitting layer preferably contains an acene compound. This constitution limits electron transfer from the first light-emitting layer to the hole-injection layer to an adequate extent while maintaining the excellent transport of holes from the hole-injection layer to the first light-emitting layer.

The acene compound is preferably a naphthacene derivative. This constitution additionally allows an excellent luminous efficiency of the first light-emitting layer without compromising the advantages described above, namely, adequately limited transfer of electrons and excellent transport of holes.

The content ratio of the acene compound in the first light-emitting layer is preferably in the range of 90 to 99.99 wt %. This constitution also contributes to the excellent luminous efficiency of the first light-emitting layer without compromising the advantages described above, namely, adequately limited transfer of electrons and excellent transport of holes.

Incidentally, the light-emitting portion preferably has an intermediate layer interposed between the first and second light-emitting layers. This constitution ensures well-balanced light emission from the first, second, and third light-emitting layers.

It is also preferable that the first light-emitting layer emits red light on energization between the cathode and the anode and that the second and third light-emitting layers emit blue and green light or vice versa on energization between the cathode and the anode. This constitution allows a white light-emitting element to be produced with well-balanced light emission from the first, second, and third light-emitting layers.

The benzidine derivative, which is the main material of the hole-injection layer, preferably has a content ratio in the range of 50 to 100 wt % with respect to the hole-injection layer. This constitution further ensures that the hole-injection layer has an excellent performance in receiving and giving holes.

A light-emitting apparatus according to an aspect of the invention contains any light-emitting element according to an aspect of the invention; it is provided with an improved yield in production, an enhanced luminous efficiency, and a decreased driving voltage requirement.

A display according to an aspect of the invention contains any light-emitting apparatus according to an aspect of the invention; it is provided with an excellent reliability.

An electronic device according to an aspect of the invention contains any display according to an aspect of the invention; it is provided with an excellent reliability.

BRIEF DESCRIPTION OF THE DRAWINGS

The invention will be described with reference to the accompanying drawings, wherein like numbers reference like parts.

DESCRIPTION OF EXEMPLARY EMBODIMENTS

The following details some preferable embodiments of a light-emitting element, a light-emitting apparatus, a display, and an electronic device according to some aspects of the invention with reference to drawings.

Embodiment 1

Figure 1:
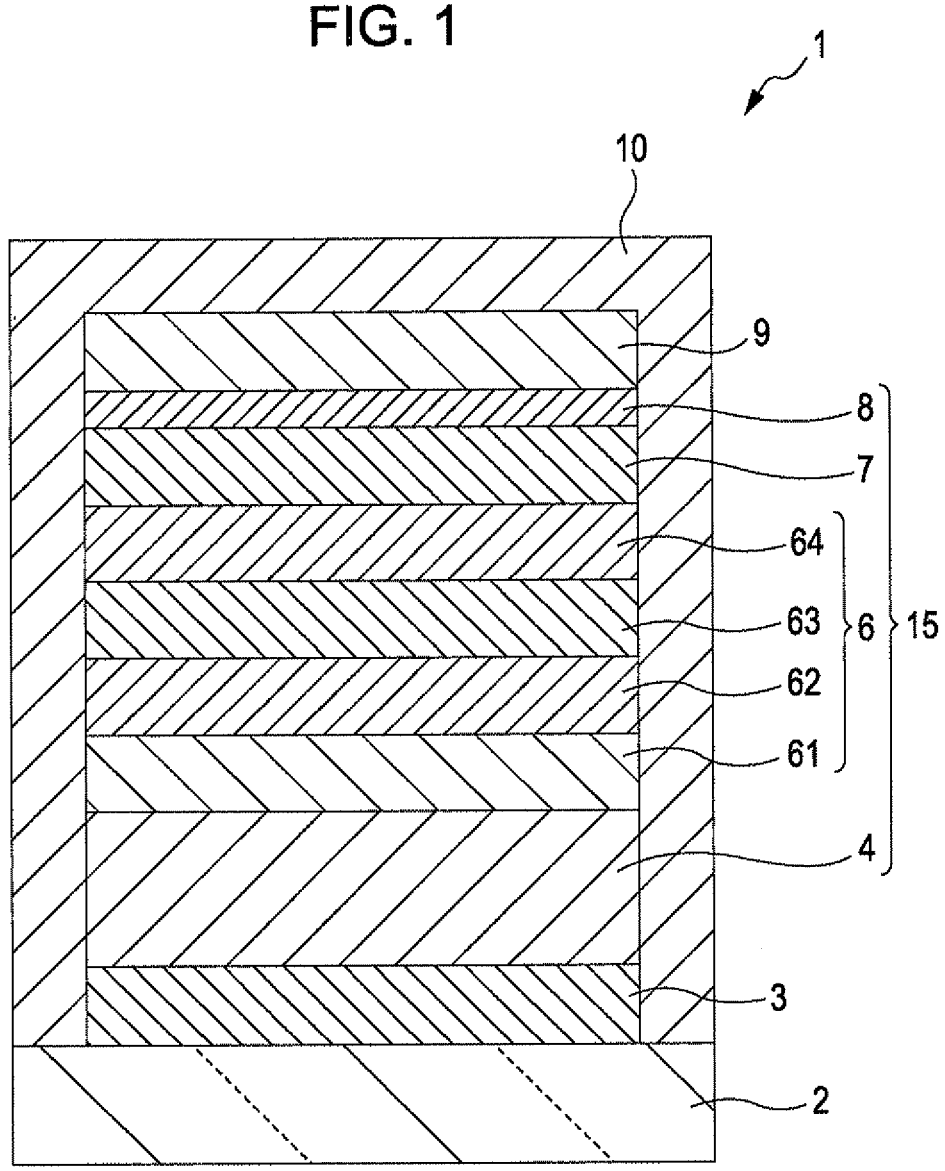
FIG. 1 is a schematic cross-sectional view of a light-emitting element according to Embodiment 1 of an aspect of the invention.

FIG. 1 is a schematic cross-sectional view of a light-emitting element according to Embodiment 1 of an aspect of the invention. Note that in the following description, for convenience, the upper side of FIG. 1 is simply referred to as the upper side, and the lower side of FIG. 1 is simply referred to as the lower side.

FIG. 1 illustrates a light-emitting element (EL element) 1, a white light-emitting element.

The light-emitting element 1 can be obtained by layering an anode 3, a hole-injection layer 4, a light-emitting portion 6, an electron-transport layer 7, an electron-injection layer 8, and a cathode 9 in this order. In other words, the light-emitting element 1 has a laminate 15 interposed between the anode 3 and the cathode 9, and the laminate 15 contains the hole-injection layer 4, the light-emitting portion 6, the electron-transport layer 7, and the electron-injection layer 8 layered in this order from the anode 3 side toward the cathode 9 side. The light-emitting portion 6 contains a red light-emitting layer (a first light-emitting layer) 61, an intermediate layer 62, a blue light-emitting layer (a second light-emitting layer) 63, and a green light-emitting layer (a third light-emitting layer) 64 layered in this order from the anode 3 side to the cathode 9 side. The light-emitting element 1 as a whole is formed on a substrate 2 and covered with a cover 10.

In this light-emitting element 1, driving voltage is applied between the anode 3 and the cathode 9, driving the anode 3 and the cathode 9 to supply (inject) holes and electrons, respectively, to the red light-emitting layer 61, the blue light-emitting layer 63, and the green light-emitting layer 64. The holes and the electrons are coupled once again in each light-emitting layer, emitting some amount of energy. Excited neutral particles, or excitons, are generated taking the energy, and then return to the ground state, releasing the energy in the form of fluorescent or phosphorescent light, or emitting light. As a result, the light-emitting element 1 produces white light as the combination of red light (R), green light (G), and blue light (B).

The substrate 2 carries the anode 3. In this embodiment, the light-emitting element 1 has a bottom emission type constitution, in which light is emitted from the substrate 2 side, and thus the substrate 2 and the anode 3 may be optically transparent or semitransparent, with or without a color.

Examples of materials that can be used to constitute the substrate 2 include resin materials such as polyethylene terephthalate, polyethylene naphthalate, polypropylene, cycloolefin polymers, polyamides, polyether sulfones, polymethyl methacrylate, polycarbonates, and polyarylates, glass materials such as quartz glass and soda-lime glass, and so forth. The substrate 2 may be made of any one or more of these materials.

The average thickness of the substrate 2 is preferably on the order of 0.1 to 30 mm, more preferably 0.1 to 10 mm, although no particular limitation is imposed thereon.

When the light-emitting element 1 has a top emission type constitution, in which light is emitted from the side opposite to the substrate 2, the substrate 2 may be optically transparent or nontransparent.

Examples of nontransparent substrates include ones made of alumina or any other ceramic material, ones made of stainless steel or any other metallic material and surface-coated with an oxide film (an insulating film), ones made of any resin material, and so forth.

Incidentally, the distance between the anode 3 and the cathode 9 (i.e., the average thickness of the laminate 15) is preferably in the range of 150 to 300 nm, more preferably 150 to 250 nm, and even more preferably 160 to 200 nm. This allows easy and reliable lowering of the driving voltage requirement for the light-emitting element 1.

With A and B as the distance between the anode 3 and the cathode 9 and the average thickness of the hole-injection layer 4, respectively, (A-B) is preferably in the range of 80 to 150 nm, more preferably 80 to 130 nm, and even more preferably 80 to 100 nm. This also contributes to easy and reliable lowering of the driving voltage requirement for the light-emitting element 1.

Hereinafter, the components of the light-emitting element 1 are individually described.

Anode

The anode 3 is an electrode that injects holes into the light-emitting portion 6 (the red light-emitting layer 61) via the hole-injection layer 4 (detailed later) and is preferably made of a material with a large work function and a high electric conductivity.

Examples of materials that can be used to constitute the anode 3 include oxides such as ITO, IZO (indium zinc oxide), $In_2O_3$, $SnO_2$, Sb-containing $SnO_2$, and Al-containing ZnO, metals such as Au, Pt, Ag, and Cu, alloys containing these metals, and so forth. The anode 3 may be made of any one or more of these materials.

In particular, ITO is suitable for the use as a material of the anode 3 because of its transparency, large work function, and high electric conductivity. The use of ITO allows efficient injection of holes from the anode 3 into the hole-injection layer 4.

The anode 3 preferably has its surface on the side of the hole-injection layer 4 (the upper surface) treated with plasma. This increases both chemical stability and mechanical integrity of the boundary between the anode 3 and the hole-injection layer 4, thereby improving injection of holes from the anode 3 into the hole-injection layer 4. For the details of the plasma treatment mentioned here, see the description about preparation of the light-emitting element 1 later.

The average thickness of the anode 3 is preferably on the order of 10 to 200 nm, more preferably 50 to 150 nm, although no particular limitation is imposed thereon.

Cathode

The cathode 9 is an electrode that injects electrons into the electron-transport layer 7 via the electron-injection layer 8 (detailed later) and is preferably made of a material with a small work function.

Examples of materials that can be used to constitute the cathode 9 include metals such as Li, Mg, Ca, Sr, La, Ce, Er, Eu, Sc, Y, Yb, Ag, Cu, Al, Cs, and Rb, alloys containing these metals, and so forth. The cathode 9 may be made of any one or more of these materials, or formed into a laminate of different layers, a layer containing different materials, or the like.

In particular, when an alloy is contained in the cathode 9, preferable alloys include ones containing Ag, Al, Cu, or any other stable metal element, more specifically, MgAg, AlLi, CuLi, and other similar alloys. The use of this class of alloy as a material of the cathode 9 allows more efficient and stable injection of electrons from the cathode 9.

The average thickness of the cathode 9 is preferably on the order of 100 to 10000 nm, more preferably 100 to 500 nm, although no particular limitation is imposed thereon.

Note that in this embodiment, the light-emitting element 1 has a bottom emission type constitution, and thus the cathode 9 does not have to be optically transparent.

Hole-Injection Layer

The hole-injection layer 4 can receive and give holes, which are supplied from the anode 3, in an efficient manner and is interposed between and in direct contact with the anode 3 and the red light-emitting layer 61 (detailed later), namely, the closest light-emitting layer to the anode 3.

Since there is only the hole-injection layer 4 between the anode 3 and the light-emitting portion 6, more specifically, the red light-emitting layer 61, the number of layers constituting the light-emitting element 1 is small. Therefore, the light-emitting element 1 can be operated with a low driving voltage.

As for constitution, the hole-injection layer 4 is mainly composed of a benzidine derivative.

Benzidine derivatives have an excellent performance in receiving and giving holes. Composed mainly of a benzidine derivative, the hole-injection layer 4 allows efficient injection and transport of holes from the anode 3 therethrough to the light-emitting portion 6 or the red light-emitting layer 61. Therefore, the light-emitting element 1 can have a high luminous efficiency.

As described above, the excellent performance of benzidine derivatives in receiving and giving holes also allows the hole-injection layer 4 to have an increased thickness. So, during preparation of the light-emitting element 1 (detailed later), the hole-injection layer 4 can be so formed as to mask (bury) any foreign matter existing on the anode 3. This increased thickness of the hole-injection layer 4 prevents or reduces contamination by foreign matter over several constituent layers of the light-emitting element 1, thereby preventing interlayer short-circuits induced by foreign matter. As a result, the light-emitting element 1 can be produced with a good yield.

Any benzidine derivative can be used to constitute the hole-injection layer 4 as long as it has a benzidine backbone. Examples of the benzidine derivative include the compound expressed by Formula (4-1) below, N,N,N',N'-tetraphenylbenzidine, and its derivatives.

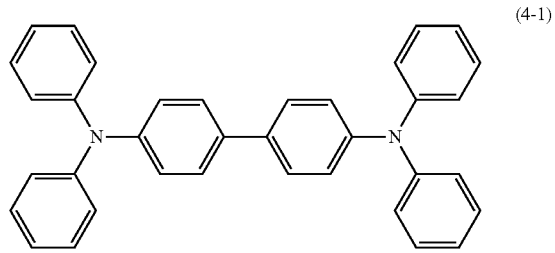 [SMILES: c1ccc(N(c2ccccc2)c2ccc(-c3ccc(N(c4ccccc4)c4ccccc4)cc3)cc2)cc1]

(4-1)

Examples of derivatives of the compound expressed by Formula (4-1) include the compounds expressed by Formulae (4-2) to (4-7) and other similar compounds.

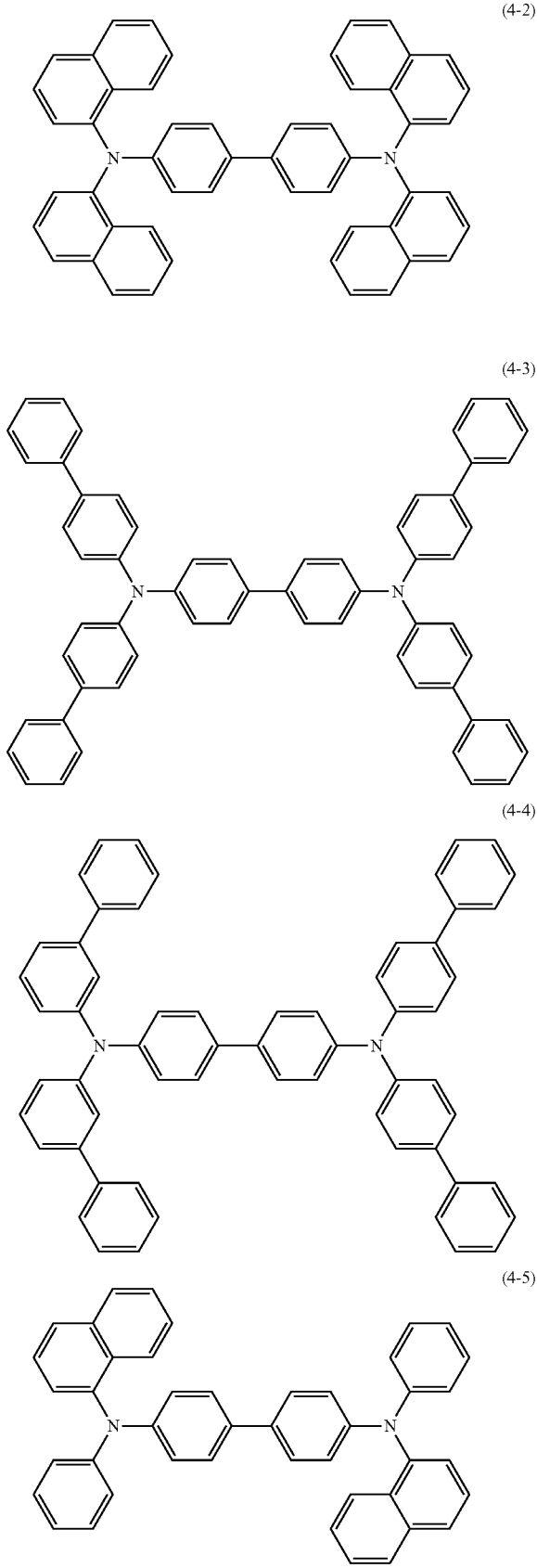
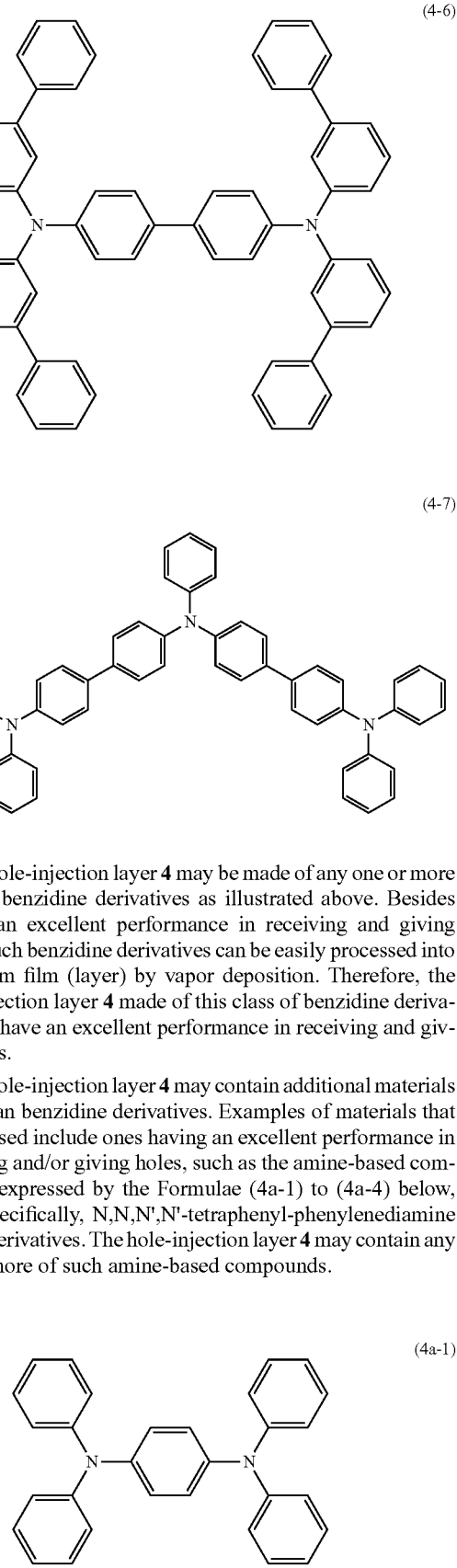

The hole-injection layer 4 may be made of any one or more of such benzidine derivatives as illustrated above. Besides having an excellent performance in receiving and giving holes, such benzidine derivatives can be easily processed into a uniform film (layer) by vapor deposition. Therefore, the hole-injection layer 4 made of this class of benzidine derivative can have an excellent performance in receiving and giving holes.

The hole-injection layer 4 may contain additional materials other than benzidine derivatives. Examples of materials that can be used include ones having an excellent performance in receiving and/or giving holes, such as the amine-based compounds expressed by the Formulae (4a-1) to (4a-4) below, more specifically, N,N,N',N'-tetraphenyl-phenylenediamine and its derivatives. The hole-injection layer 4 may contain any one or more of such amine-based compounds.

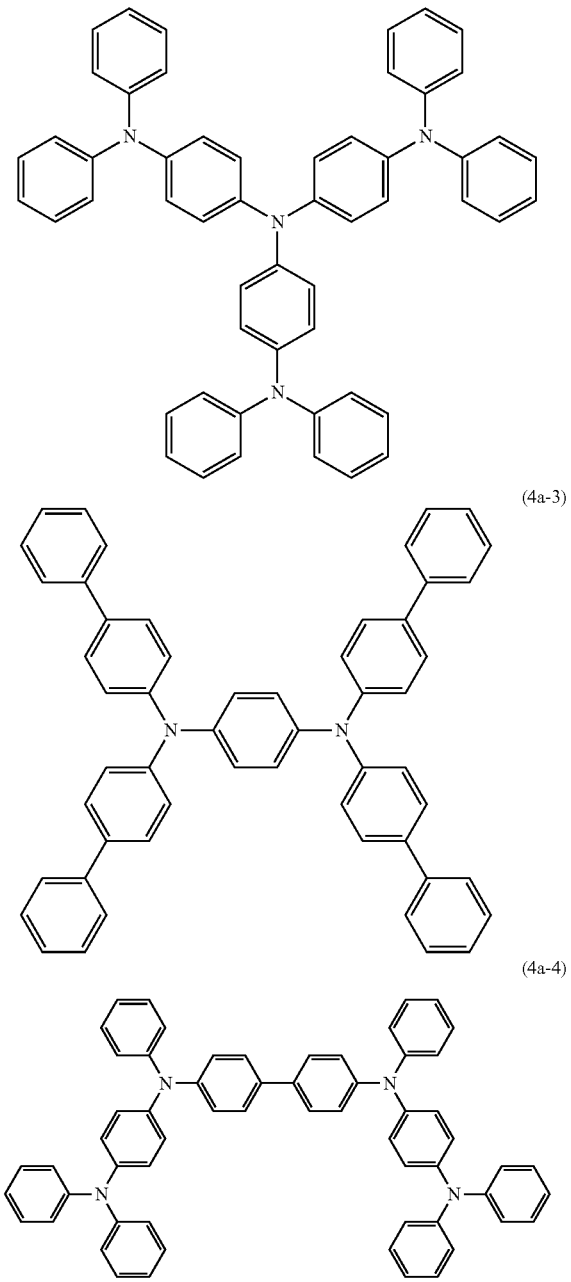

(4a-2)

(4a-3)

(4a-4)

The content ratio of the benzidine derivative(s) in the hole-injection layer 4 is preferably in the range of 50 to 100 wt %, more preferably 70 to 100 wt %, and even more preferably 90 to 100 wt %, although no particular limitation is imposed thereon. This helps the benzidine derivative(s) exercise the performance thereof in receiving and giving holes in an efficient manner, thereby enhancing the performance of the hole-injection layer 4 in receiving and giving holes.

The average thickness of the hole-injection layer 4 is preferably in the range of 80 to 200 nm, more preferably 80 to 180 nm, and even more preferably 90 to 150 nm. This also contributes to easy and reliable lowering of the driving voltage requirement for the light-emitting element 1 and allows the hole-injection layer 4 to be so formed as to mask (bury) any foreign matter existing on the anode 3.

When the average thickness of the hole-injection layer 4 is smaller than the lower limit specified above, any large foreign matter existing on the anode 3 may possibly lie over too many constituting layers of the light-emitting element 1 during manufacturing, and such foreign matter may cause interlayer short-circuits. When the average thickness of the hole-injection layer 4 exceeds the upper limit specified above, the light-emitting element 1 often requires a high driving voltage to operate. In this case, the distance between the anode 3 and the cathode 9 (i.e., the average thickness of the laminate 15) may be too great depending on the constitution and material of constituting layers other than the hole-injection layer 4, and this may also increase the driving voltage requirement for the light-emitting element 1.

Light-Emitting Portion

As described above, the light-emitting portion 6 contains a red light-emitting layer (a first light-emitting layer) 61, an intermediate layer 62, a blue light-emitting layer (a second light-emitting layer) 63, and a green light-emitting layer (a third light-emitting layer) 64 layered in this order from the anode 3 side to the cathode 9 side.

Red Light-Emitting Layer

The red light-emitting layer (first light-emitting layer) 61 contains any red light-emitting material (first light-emitting material) that can emit red light (a first color).

No particular limitation is imposed on the type and number of the red light-emitting material. Any one or more materials can be used as long as they can produce red fluorescent or phosphorescent light.

Examples of possible red fluorescent materials include perylene derivatives such as tetraaryldiindenoperylene, expressed by Formula (61-1) below, europium complexes, benzopyrane derivatives, rhodamine derivatives, benzothioxanthene derivatives, porphyrin derivatives, Nile red, {2-(1,1-dimethylethyl)-6-[2-(2,3,6,7-tetrahydro-1,1,7,7-tetramethyl-1H,5H-benzo[ij]quinolizine-9-yl)ethenyl]-4H-pyran-4-ylidene}propanedinitrile (DCJTB), 4-dicyanomethylene-2-methyl-6-p-dimethylaminostyryl-4H-pyran (DCM), and so forth.

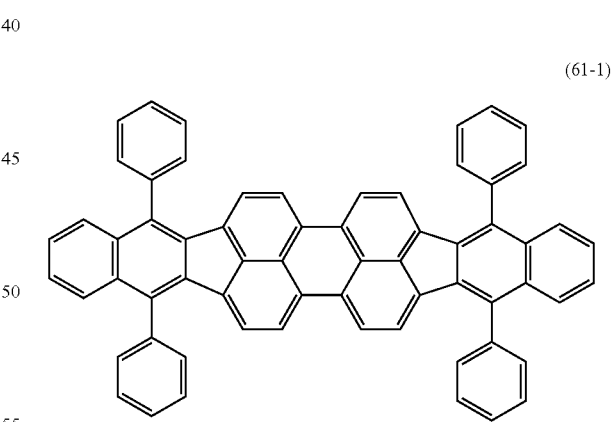

(61-1)

Examples of possible red phosphorescent materials include complexes of iridium, ruthenium, platinum, osmium, rhenium, palladium, and other metals, those with a phenylpyridine, bipyridyl, or porphyrin backbone in at least one of the ligands thereof, and so forth. Specific examples include tris(1-phenylisoquinoline)iridium, bis[2-(2'-benzo[4,5-α]thienyl)pyridinate-N,C$^{3'}$]iridium(acetylacetonate) (btp2Ir (acac)), 2,3,7,8,12,13,17,18-octaethyl-12H,23H-porphyrin-platinum (II), bis[2-(2'-benzo[4,5-α]thienyl)pyridinate-N, C$^{3'}$]iridium, bis(2-phenylpyridine)iridium(acetylacetonate), and so forth.

Besides the red light-emitting material(s), the red light-emitting layer 61 may further contain any host material (first host material) to which the red light-emitting material(s) can be added as guest material and dopant (or that can carry the red light-emitting material(s)). The host material(s) not only couples holes and electrons to form excitons but also transfers the energy of the excitons to the red light-emitting material(s) by Förster or Dexter energy transfer to excite the red light-emitting material(s). When any first host material is used, for example, the first host material is doped with the red light-emitting material(s) as guest material and dopant.

No particular limitation is imposed on the type and number of the first host material. Any one or more first host materials can be used as long as they can be in the above-described relationship with the red light-emitting material(s) chosen.

When any red fluorescent material is used, examples of possible first host materials include distyrylarylene derivatives, anthracene derivatives such as the compound expressed by Formula (61a-1) below or 2-t-butyl-9,10-di(2-naphthyl) anthracene (TBADN), perylene derivatives, distyrylbenzene derivatives, distyrylamine derivatives, quinolinolate-metal complexes such as tris(8-quinolinolate)aluminum ($Alq_3$), triarylamine derivatives such as triphenylamine tetramers, oxadiazole derivatives, naphthacene and its derivatives such as the compound expressed by Formula (61a-2) below, silole derivatives, dicarbazole derivatives, oligothiophene derivatives, benzopyrane derivatives, triazole derivatives, benzoxazole derivatives, benzothiazole derivatives, quinoline derivatives, 4,4'-bis(2,2'-diphenylvinyl)biphenyl (DPVBi), and so forth. These materials may be used alone or in combination of two or more kinds.

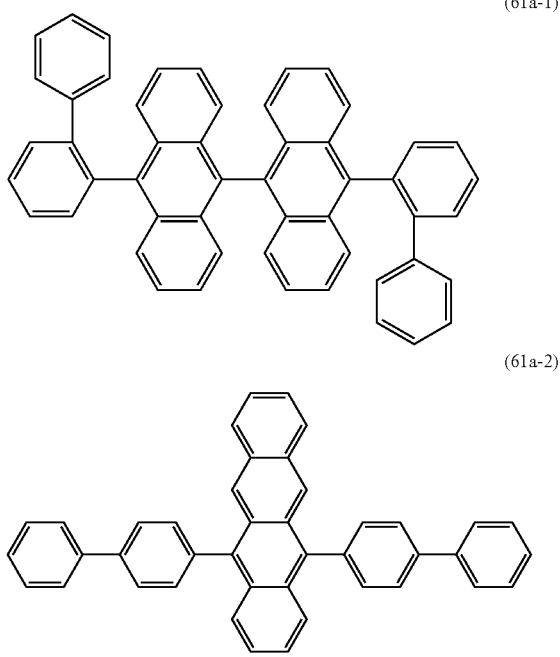

(61a-1)

(61a-2)

When any red phosphorescent material is used, examples of possible first host materials include carbazole derivatives such as 3-phenyl-4-(1'-naphthyl)-5-phenylcarbazole and 4,4'-N,N'-dicarbazolebiphenyl (CBP), and so forth. These materials may be used alone or in combination of two or more kinds.

In particular, acene compounds (compounds having an acene backbone), such as naphthalene derivatives, anthracene derivatives, tetracene derivatives, pentacene derivatives, hexacene derivatives, and heptacene derivatives, are suitable for the use as (one of) the first host material(s). In other words, the red light-emitting layer 61 preferably contains any acene compound. This limits electron transfer from the red light-emitting layer 61 to the hole-injection layer 4 to an adequate extent while maintaining the excellent transport of holes from the hole-injection layer 4 to the red light-emitting layer 61.

It is particularly preferable that the acene compound used as (one of) the first host material(s) is any tetracene (naphthacene) derivative. This additionally allows an excellent luminous efficiency of the red light-emitting layer 61 without compromising the advantages of the first host material(s) described above, namely, adequately limited transfer of electrons and excellent transport of holes.

The content ratio of the acene compound (first host material) in the red light-emitting layer 61 is preferably in the range of 90 to 99.99 wt %, more preferably 95 to 99.9 wt %. This also contributes to the advantages of the first host material(s) described above, namely, the excellent luminous efficiency, adequately limited transfer of electrons, and excellent transport of holes.

When the red light-emitting layer 61 contains any first host material, the content ratio or doping amount of the red light-emitting material(s) is preferably in the range of 0.01 to 10 wt %, more preferably 0.1 to 5 wt %, with respect to the red light-emitting layer 61. This optimizes the luminous efficiency by allowing the red light-emitting layer 61 to produce light that is well-balanced in terms of intensity with those produced by the blue light-emitting layer 63 and the green light-emitting layer 64 (both detailed later).

The average thickness of the red light-emitting layer 61 is preferably on the order of 1 to 20 nm, more preferably 3 to 10 nm, although no particular limitation is imposed thereon.

Intermediate Layer

The intermediate layer 62 is interposed between and in direct contact with the above-described red light-emitting layer 61 and the later-described blue light-emitting layer 63. The intermediate layer 62 has three functions: It regulates the quantity of electrons transported from the blue light-emitting layer 63 to the red light-emitting layer 61, regulates the quantity of holes transported from the red light-emitting layer 61 to the blue light-emitting layer 63, and prevents the energy of excitons from migrating between the red light-emitting layer 61 and the blue light-emitting layer 63. Functioning as described above, the intermediate layer 62 allows efficient light emission by the red light-emitting layer 61 and the blue light-emitting layer 63. With such well-balanced light emission from the individual light-emitting layers, the light-emitting element 1 can produce light in any intended color (white in this embodiment) at an improved luminous efficiency for a prolonged period of time.

As for constitution, no particular limitation is imposed on the material of the intermediate layer 62. Any kind of material can be used as long as the intermediate layer 62 can function as described above. Examples of possible materials include ones that can transport holes (hole-transport materials), ones that can transport electrons (electron-transport materials), and so forth.

No particular limitation is imposed on the type of the hole-transport material. Any hole-transport material can be used to constitute the intermediate layer 62 as long as the intermediate layer 62 can function as described above. Examples include amine-based compounds, namely, compounds with an amine backbone, and preferable examples include benzidine-based amine derivatives.

Among others, benzidine-based amine derivatives that have two or more aromatic rings are particularly suitable for the use as an amine-based material for the intermediate layer 62, and tetraarylbenzidine derivatives are more suitable. Examples of the benzidine-based amine derivatives include the compound expressed by Formula (62-1) below, N,N'-bis(1-naphthyl)-N,N'-diphenyl(1,1-biphenyl)-4,4'-diamine (α-NPD), N,N,N',N'-tetranaphthyl-benzidine (TNB), and so forth. This class of amine-based compound generally has an excellent performance in receiving and giving holes. Therefore, the use of this kind of material allows smooth transport of holes from the red light-emitting layer 61, via the intermediate layer 62, to the blue light-emitting layer 63.

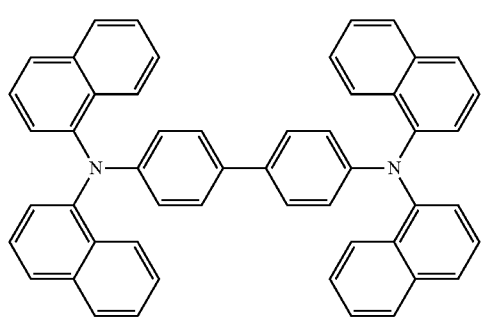

(62-1)

Also, no particular limitation is imposed on the type and number of the electron-transport material. Any one or more electron-transport materials can be used to constitute the intermediate layer 62 as long as the intermediate layer 62 can function as described above. Examples include acene compounds, which have an excellent performance in receiving and giving holes and thus allow smooth transport of electrons from the blue light-emitting layer 63, via the intermediate layer 62, to the red light-emitting layer 61. Furthermore, acene compounds are highly resistant to attack by excitons and thus can protect the intermediate layer 62 from deterioration induced by excitons, thereby providing the light-emitting element 1 with a high durability.

Examples of acene compounds include naphthalene derivatives, anthracene derivatives, tetracene derivatives, pentacene derivatives, hexacene derivatives, and heptacene derivatives, and these materials may be used alone or in combination of two or more kinds. However, naphthalene derivatives and anthracene derivatives are preferable, and anthracene derivatives are more preferable than naphthalene derivatives. Examples of the anthracene derivatives include the compound expressed by Formula (61a-1) above, 2-t-butyl-9,10-di(2-naphthyl)anthracene (TBADN), and so forth.

The average thickness of the intermediate layer 62 is preferably on the order of 5 to 50 nm, more preferably 10 to 30 nm, although no particular limitation is imposed thereon.

Note that some constitutions of the light-emitting element 1, including types, thicknesses, and materials of constituent layers, may permit the omission of the intermediate layer 62.

Blue Light-Emitting Layer

The blue light-emitting layer (second light-emitting layer) 63 contains any blue light-emitting material (second light-emitting material) that can emit blue light (a second color).

No particular limitation is imposed on the type and number of the blue light-emitting material. Any one or more materials can be used as long as they can produce blue fluorescent or phosphorescent light.

Examples of possible blue fluorescent materials include the compound expressed by Formula (63-1) below, distyrylamine derivatives, fluoranthene derivatives, pyrene derivatives, perylene and its derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[9,9-dioctylfluoren-2,7-diyl)-co-(2,5-dimethoxybenzen-1,4-diyl)], poly{(9,9-dihexyloxyfluoren-2,7-diyl)-alt-co-[2-methoxy-5-(2-ethoxyhexyloxy) phenylen-1,4-diyl]}, poly[(9,9-dioctylfluoren-2,7-diyl)-co-(ethynylbenzene)], and so forth. These materials may be used alone or in combination of two or more kinds.

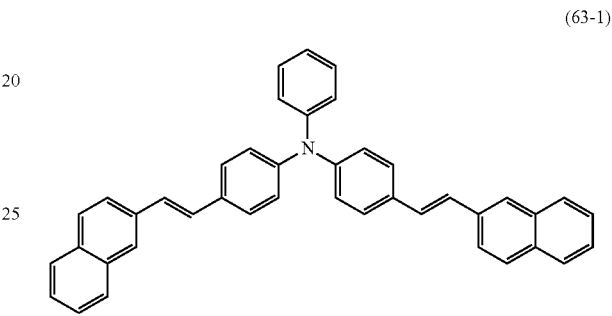

(63-1)

Examples of possible blue phosphorescent materials include complexes of iridium, ruthenium, platinum, osmium, rhenium, palladium, and other metals. Specific examples include bis(4,6-difluorophenylpyridinate-N,C$^{2'}$)-picolinate-iridium, tris[2-(2,4-difluorophenyl)pyridinate-N,C$^{2'}$]iridium, bis[2-(3,5-trifluoromethyl)pyridinate-N,C$^{2'}$]-picolinate-iridium, bis(4,6-difluorophenylpyridinate-N,C$^{2'}$) iridium(acetylacetonate), and so forth.

Besides the blue light-emitting material, the blue light-emitting layer 63 may further contain any host material (second host material) to which the blue light-emitting material(s) can be added as guest material and dopant (or that can carry the blue light-emitting material(s)). Examples of materials that can be used as the second host material(s), namely, the host material(s) for the blue light-emitting layer 63, are the same as those for the first host material(s), namely, the host material(s) for the red light-emitting layer 61. The second host material(s) is preferably chosen from acene compounds, and more preferably from anthracene derivatives.

When the blue light-emitting layer 63 contains any second host material, the content ratio or doping amount of the blue light-emitting material(s) is preferably in the range of 0.01 to 20 wt %, more preferably 1 to 15 wt %, with respect to the blue light-emitting layer 63. This optimizes the luminous efficiency by allowing the blue light-emitting layer 63 to produce light that is well-balanced in terms of intensity with those produced by the red light-emitting layer 61 and the green light-emitting layer 64 (detailed later).

The average thickness of the blue light-emitting layer 63 is preferably on the order of 5 to 50 nm, more preferably 10 to 40 nm, although no particular limitation is imposed thereon.

Green Light-Emitting Layer

The green light-emitting layer (third light-emitting layer) 64 contains any green light-emitting material (third light-emitting material) that can emit green light (a third color).

No particular limitation is imposed on the type and number of the green light-emitting material. Any one or more materials can be used as long as they can produce green fluorescent or phosphorescent light.

Examples of possible blue fluorescent materials include coumarin derivatives, quinacridone and its derivatives, 9,10-bis[(9-ethyl-3-carbazoyl)-vinylenyl]-anthracene, poly(9,9-dihexyl-2,7-vinylenefluorenylene), poly{(9,9-diocrtylfluoren-2,7-diyl)-co-[1,4-diphenylenvinylen-2-methoxy-5-(2-ethylhexyloxy)benzene]}, poly{9,9-dioctyl-2,7-divinylenefluorenylene)-alt-co-[2-methoxy-5-(2-ethoxyhexyloxy)-1,4-phenylene]}, and so forth. These materials may be used alone or in combination of two or more kinds.

Examples of possible green phosphorescent materials include complexes of iridium, ruthenium, platinum, osmium, rhenium, palladium, and other metals, those with a phenylpyridine, bipyridyl, or porphyrin backbone in at least one of the ligands thereof, and so forth. Specific examples include fac-tris(2-phenylpyridine)iridium ($Ir(ppy)_3$), bis(2-phenylpyridinate-N,$C^{2'}$)iridium(acetylacetonate), and fac-tris[5-fluoro-2-(5-trifluoromethyl-2-pyridine)phenyl-C,N]iridium.

The green light-emitting layer 64 may further contain any host material (third host material). The third host material(s) is preferably chosen from acene compounds, more preferably from anthracene derivatives. For a lower driving voltage requirement and a higher luminous efficiency, the third host material(s) is preferably the same as the host material(s) for the above-described blue light-emitting layer 63 (the second host material(s)). In addition, the light-emitting material(s) for the green light-emitting layer 64 can be the same as the host material(s) for the red light-emitting layer 61.

When the green light-emitting layer 64 contains any third host material, the content ratio or doping amount of the green light-emitting material(s) is preferably in the range of 0.01 to 20 wt %, more preferably 0.5 to 15 wt %, with respect to the green light-emitting layer 64. This optimizes the luminous efficiency by allowing the green light-emitting layer 64 to produce light that is well-balanced in terms of intensity with those produced by the red light-emitting layer 61 and the blue light-emitting layer 63.

The average thickness of the green light-emitting layer 64 is preferably on the order of 5 to 50 nm, more preferably 10 to 40 nm, although no particular limitation is imposed thereon.

Electron-Transport Layer

The electron-transport layer 7 can transport holes by receiving them from the cathode 9 via the electron-injection layer 8 and giving them to the green light-emitting layer 64.

Examples of materials that can be used to constitute the electron-transport layer 7 (electron-transport materials) include quinoline derivatives, oxadiazole derivatives, perylene derivatives, pyridine derivatives, pyrimidine derivatives, quinoxaline derivatives, diphenylquinone derivatives, nitrofluorene derivatives, and so forth. The quinoline derivatives include organic metal complexes having 8-quinolinol or any of its derivative as ligands, such as the compound expressed by Formula (7-1) below, tris(8-quinolinolate)aluminum ($Alq_3$). These materials may be used alone or in combination of two or more kinds.

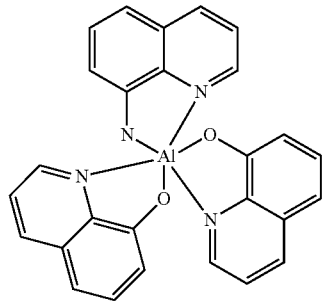

(7-1)

The average thickness of the electron-transport layer 7 is preferably on the order of 0.5 to 100 nm, more preferably 1 to 50 nm, although no particular limitation is imposed thereon.

Note that some constitutions of the light-emitting element 1, including types, thicknesses, and materials of constituent layers, may permit the omission of the electron-transport layer 7.

Electron-Injection Layer

The electron-injection layer 8 improves the efficiency of electron injection from the cathode 9.

Examples of materials that can be used to constitute the electron-injection layer 8 (electron-injection materials) include kinds of inorganic insulating materials, kinds of inorganic semiconductor materials, and so forth.

Examples of the inorganic insulating materials include alkali metal chalcogenides (oxides, sulfates, celenides, and tellurides), alkaline earth metal chalcogenides, alkali metal halides, alkaline earth metal halides, and so forth. These materials may be used alone or in combination of two or more kinds. When composed mainly of any of these materials, the electron-injection layer 8 better improves injection of electrons. In particular, alkali metal compounds (e.g., alkali metal chalcogenides and alkali metal halides) have a very small work function and thus, when contained in the electron-injection layer 8, provide the resultant light-emitting element 1 with a high brightness.

Examples of the alkali metal chalcogenides include $Li_2O$, LiO, $Na_2S$, $Na_2Se$, NaO, and so forth. Examples of the alkaline earth metal chalcogenides include CaO, BaO, SrO, BeO, BaS, MgO, CaSe, and so forth. Examples of the alkali metal halides include CsF, LiF, NaF, KF, LiCl, KCl, NaCl, and so forth. Examples of the alkaline metal halides include $CaF_2$, $BaF_2$, $SrF_2$, $MgF_2$, $BeF_2$, and so forth.

As for the inorganic semiconductor materials, possible examples include oxides, nitrides, oxide-nitrides, and other similar compounds that contain at least one of the following elements: Li, Na, Ba, Ca, Sr, Yb, Al, Ga, In, Cd, Mg, Si, Ta, Sb, and Zn. These materials may be used alone or in combination of two or more kinds.

The average thickness of the electron-injection layer 8 is preferably on the order of 0.1 to 1000 nm, more preferably 0.2 to 100 nm, and even more preferably 0.2 to 50 nm, although no particular limitation is imposed thereon.

Note that some constitutions of the light-emitting element 1, including types, thicknesses, and materials of constituent layers, may permit the omission of the electron-injection layer 8.

Cover

The cover 10 covers the anode 3, the laminate 15, and the cathode 9 and provides an airtight seal to protect them from oxygen and moisture, thereby improving the reliability of the light-emitting element 1 and the resistance of it against alteration and deterioration and offering some other advantages.

Examples of materials that can be used to constitute the cover 10 include Al, Au, Cr, Nb, Ta, and Ti, their alloys, silicon oxide, kinds of resin materials, and so forth. When any electrically conductive material is used to constitute the cover 10, an insulating film is preferably placed between the cover 10 and the structure constituted by the anode 3, the laminate 15, and the cathode 9, if it is necessary for the prevention of short-circuits.

The cover 10 may be a plate facing the substrate 2 as long as the gap between the two members can be filled with a sealant such as a thermosetting resin material.

Constituted as above, the light-emitting element 1 has the hole-injection layer 4 mainly composed of benzidine derivative(s) and interposed between and in direct contact with the anode 3 and the red light-emitting layer 61. There is only the hole-injection layer 4 between the anode 3 and the red light-emitting layer 61 (light-emitting portion 6), and thus the number of layers constituting the light-emitting element 1 is small. Therefore, the light-emitting element 1 can be operated with a low driving voltage.

Benzidine derivatives have an excellent performance in receiving and giving holes. Composed mainly of benzidine derivative(s), the hole-injection layer 4 allows efficient injection and transport of holes from the anode 3 therethrough to the red light-emitting layer 61 (light-emitting portion 6). Therefore, the light-emitting element 1 can have a high luminous efficiency.

The excellent performance of benzidine derivatives in receiving and giving holes also allows the hole-injection layer 4 to have an increased thickness. So, during preparation of the light-emitting element 1, the hole-injection layer 4 can be so formed as to mask (bury) any foreign matter existing on the anode 3. This increased thickness of the hole-injection layer 4 prevents or reduces contamination by foreign matter over several constituent layers of the light-emitting element 1, thereby preventing interlayer short-circuits induced by foreign matter. As a result, the light-emitting element 1 can be manufactured with a good yield.

In particular, any constitution of the light-emitting element 1 with several light-emitting layers in the light-emitting portion 6 would often have a great total thickness between the anode 3 and the cathode 9 and thus require a high driving voltage to operate. An aspect of the invention is very advantageous to this kind of light-emitting element, offering the advantages described above, namely, a decreased driving voltage requirement, an enhanced luminous efficiency, and an improved yield in production.

And, with the red light-emitting layer 61, the blue light-emitting layer 63, and the green light-emitting layer 64 layered in this order from the anode 3 side to the cathode 9 side, the light-emission portion 6 offers well-balanced light emission from the three light-emitting layers, thereby providing the light-emitting element 1 with an ability to produce white light.

However, the order of the light-emitting layers is never limited to the one specified in this embodiment. Some shuffles, for example, in which the blue light-emitting layer 63 is placed under the green light-emitting layer 64, still allow well-balanced light emission from the three light-emitting layers. Also, each light-emitting layer may produce light in any color other than specified in this embodiment; for each light-emitting layer, the color of light is appropriately chosen in accordance with what color of light the light-emitting element 1 is intended to produce.

An exemplary method of preparing the light-emitting element 1 described above is as follows.

I. A substrate 2 is coated with an anode 3. Examples of the method used to form the anode 3 include chemical vapor deposition (CVD), such as plasma CVD and thermal CVD, dry plating, such as vacuum deposition, wet plating, such as electrolytic plating, as well as spraying, the sol-gel method, metal organic deposition (MOD), lamination of metal films, and so forth.

II. The anode 3 is coated with a hole-injection layer 4. Examples of the method used to form the hole-injection layer 4 include CVD, dry plating, such as vacuum deposition and sputtering, and other appropriate gas-phase processes.

Another possible way of forming the hole-injection layer 4 is as follows: A hole-injection material is dissolved in a solvent or dispersed in a dispersant, the obtained hole-injection layer material is applied onto the anode 3, and then the applied coating is dried by removal of the solvent or the dispersant.

Examples of the method used to apply the hole-injection layer material include spin coating, roller coating, ink jet printing, and other appropriate application methods. These methods make it easy to form the hole-injection layer 4.

Examples of the solvent or dispersant used to prepare the hole-injection layer material include kinds of inorganic solvents, kinds of organic solvents, their mixtures, and so forth.

Examples of the method for the drying process mentioned above include air drying under atmospheric pressure or a reduced pressure, heating, spraying of an inert gas, and so forth.

Prior to Process II, the anode 3 preferably has its upper surface treated with oxygen plasma. This activates the upper surface of the anode 3, removes or washes away any organic matter from the upper surface of the anode 3, adjusts the work function of the anode 3 around the upper surface, and offers some other advantages. As a result, an organic film can be formed on the anode 3 easily.

The type of plasma treatment is not particularly limited as long as it improves the chemical stability and mechanical integrity of the boundary between the anode 3 and the hole-injection layer 4. Any one or more kinds of plasma chosen from oxygen plasma, nitrogen plasma, argon plasma, and so forth may be used. These types of plasma treatment, in which treatment is rapidly completed and plasma is easily generated, ensure efficient surface plasma treatment of the anode 3.

Combined treatment with oxygen plasma and argon plasma is particularly preferable. When this combined treatment is used, it is preferable that the oxygen plasma treatment and the argon plasma treatment are individually conditioned as follows: plasma power: about 100 to 800 W; gas flow rate: about 15 to 50 sccm; rate of transport of the target (the anode 3): about 0.5 to 10 mm/sec; treatment duration: 0.5 to 10 seconds.

III. The hole-injection layer 4 is coated with a red light-emitting layer 61. Examples of the method used to form the red light-emitting layer 61 include dry plating, such as vacuum deposition, and other appropriate gas-phase processes.

IV. The red light-emitting layer 61 is coated with an intermediate layer 62. Examples of the method used to form the intermediate layer 62 are the same as those for the red light-emitting layer 61.

V. The intermediate layer 62 is coated with a blue light-emitting layer 63. Examples of the method used to form the blue light-emitting layer 63 are the same as those for the red light-emitting layer 61.

VI. The blue light-emitting layer 63 is coated with a green light-emitting layer 64. Examples of the method used to form the green light-emitting layer 64 are the same as those for the red light-emitting layer 61.

VII. The green light-emitting layer 64 is coated with an electron-transport layer 7. Examples of the method used to form the electron-transport layer 7 are the same as those for the red light-emitting layer 61.

Another possible way of forming the electron-transport layer 7 is as follows: An electron-transport material is dissolved in a solvent or dispersed in a dispersant, the obtained electron-transport layer material is applied onto the green light-emitting layer 64, and then the applied coating is dried by removal of the solvent or the dispersant.

VIII. The electron-transport layer 7 is coated with an electron-injection layer 8. When any inorganic material is used to constitute the electron-injection layer 8, examples of the method used to form this layer include CVD, dry plating, such as vacuum deposition and sputtering, and other appropriate gas-phase processes, as well as application and subsequent firing of ink composed of inorganic fine particles, and so forth.

IX. The electron-injection layer 8 is coated with a cathode 9. Examples of the method used to form the cathode 9 include vacuum deposition, sputtering, lamination of metal films, application and subsequent firing of ink composed of metal fine particles, and so forth.

As a result of the processes described above, the light-emitting element 1 is obtained. Finally, a cover 10 is attached to the substrate 2 to cover the light-emitting element 1.

Embodiment 2

Figure 2:
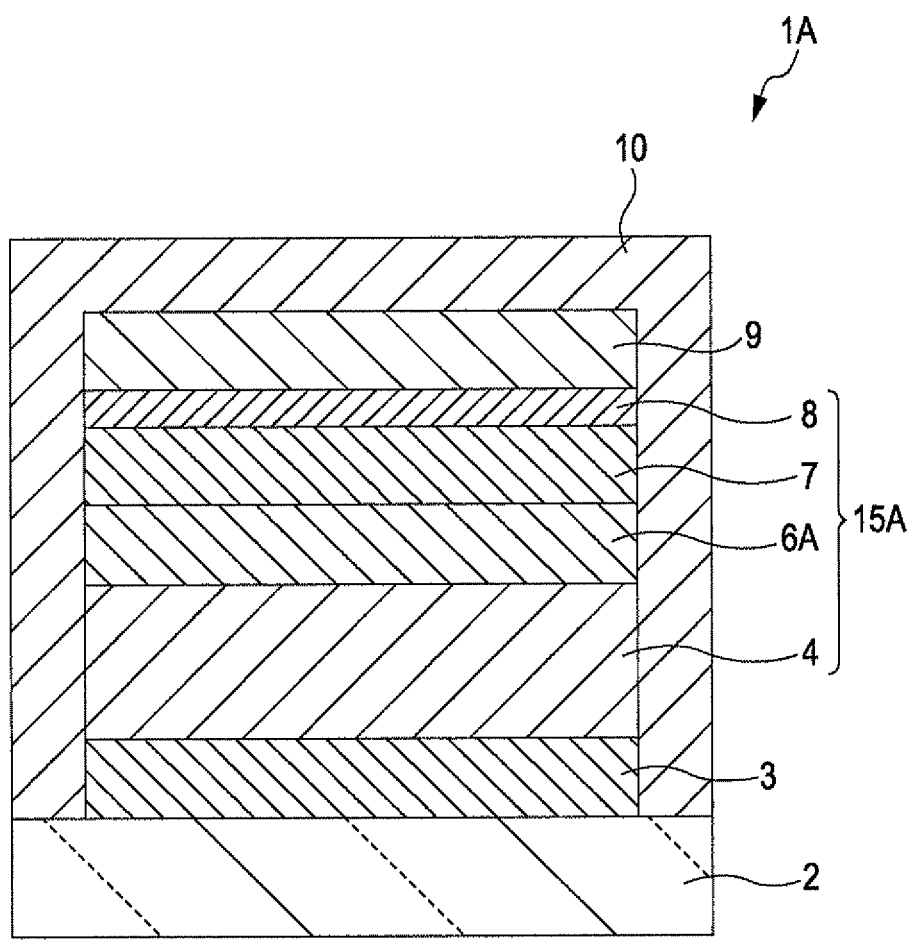
FIG. 2 is a schematic cross-sectional view of a light-emitting element according to Embodiment 2 of an aspect of the invention.

FIG. 2 is a schematic cross-sectional view of a light-emitting element according to Embodiment 2 of an aspect of the invention. Note that in the following description, for convenience, the upper side of FIG. 2 or the cathode 9 side is simply referred to as the upper side, and the lower side of FIG. 2 or the anode 3 side is simply referred to as the lower side.

The light-emitting element 1A, according to Embodiment 2, is equivalent to the light-emitting element 1, according to Embodiment 1, except that the light-emitting portion contains only a single light-emitting layer. The light-emitting element 1A has a laminate 15A interposed between an anode 3 and a cathode 9, and the laminate 15A contains a hole-injection layer 4, a light-emitting portion 6A, an electron-transport layer 7, and an electron-injection layer 8 layered in this order from the anode 3 side to the cathode 9 side.

The light-emitting portion 6A contains only a single light-emitting layer, and the light-emitting layer contains any light-emitting material.

No particular limitation is imposed on the type and number of this light-emitting material. Any one or more materials appropriately chosen from the red light-emitting materials, blue light-emitting materials, and green light-emitting materials described above and some other appropriate materials may be used.

Also, the light-emitting portion 6A may further contain any host material for carrying the light-emitting material(s). Examples of materials that can be used as the host material(s) are the same as those for the host material(s) for the red light-emitting layer 61 mentioned in Embodiment 1.

Such constitutions as described above also offer similar advantages to those offered by Embodiment 1.

An exemplary application of the light-emitting element 1 or 1A is a light-emitting apparatus according to an aspect of the invention.

Such a light-emitting apparatus, which is equipped with the light-emitting element 1 or 1A described above, features an improved yield in production, an enhanced luminous efficiency, and a decreased driving voltage requirement and can be used as a light source for illumination or other purposes and in other appropriate applications.

When several light-emitting element 1 are arranged in a matrix, a light-emitting apparatus containing them can be used in a display unit. The following describes an example of a display unit to which a display according to an aspect of the invention is applied.

Figure 3:
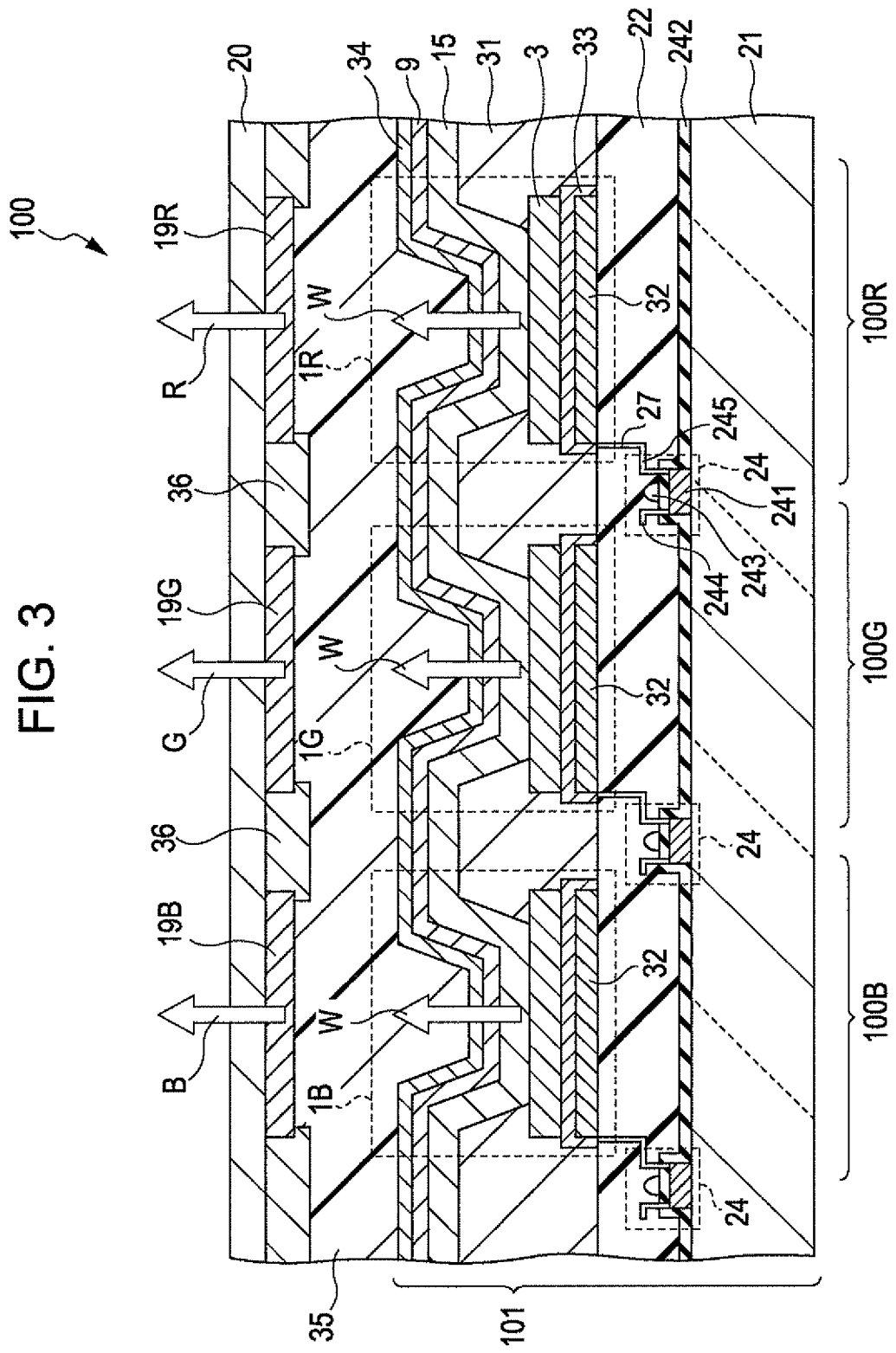
FIG. 3 is a vertical cross-sectional view of a display unit to which a display according to an aspect of the invention is applied.

FIG. 3 is a vertical cross-sectional view of an embodiment of the display unit, to which a display according to an aspect of the invention is applied.

FIG. 3 illustrates a display unit 100, which contains a light-emitting apparatus 101 and color filters 19R, 19G, and 19B. The light-emitting apparatus 101 contains light-emitting elements 1R, 1G, and 1B that correspond to subsidiary pixels 100R, 100G, and 100B, respectively. The display unit 100 is a display panel that has a top emission type constitution. As for driving mode, no particular limitation is imposed; the display unit 100 may be operated in an active matrix mode or a passive matrix mode.

Besides the light-emitting elements 1R, 1G, and 1B, the light-emitting apparatus 101 further contains a substrate 21 and driving transistors 24.

The driving transistors 24 are formed on the substrate 21 and covered with an insulating material, a flattening layer 22. Each driving transistor 24 has a semiconductor layer 241 made of silicon, a gate insulating layer 242 formed on the semiconductor layer 241, and a gate electrode 243, a source electrode 244, and a drain electrode 245 all formed on the gate insulating layer 242.

The flattening layer 22 carries the light-emitting elements 1R, 1G, and 1B, which are paired with the driving transistors 24.

The light-emitting element 1R contains a reflective film 32, an anti-corrosion film 33, an anode 3, a laminate 15, a cathode 9, and a cathode cover 34 layered in this order on the flattening layer 22. In this embodiment, the cathode 3 constitutes a pixel electrode in each of the light-emitting elements 1R, 1G, and 1B and is electrically connected to the drain electrode 245 of each driving transistor 24 via a conductive line (wiring) 27. The cathode 9 is shared by the light-emitting elements 1R, 1G, and 1B.

The light-emitting elements 1G and 1B have the same constitution as the light-emitting element 1R. However, these three light-emitting elements may have different constitutions (characteristics) of the reflective film 32 because the reflective film 32 may have varying characteristics depending on the wavelength of light it reflects. The light-emitting elements 1R, 1G, and 1B are separated from each other with partitions 31.

The light-emitting apparatus 101 constituted as above is covered as a whole with an epoxy layer 35. The epoxy layer 35, made of an epoxy resin, carries the color filters 19R, 19G, and 19B in such a manner that they can correspond to the light-emitting elements 1R, 1G, and 1B, respectively.

The color filter 19R converts white light W that comes from the light-emitting element 1R into red light. Likewise, the color filter 19G converts white light W that comes from the light-emitting element 1G into green light, and the color filter 19B converts white light W that comes from the light-emitting element 1B into blue light. This combination of the color filters 19R, 19G, and 19B and the light-emitting elements 1R, 1G, and 1B allows for full-color display.

The color filters 19R, 19G, and 19B are separated from each other with light-shielding layers 36. This prevents unintended light emission by any one or more of the subsidiary pixels 100R, 100G, and 100B. The color filters 19R, 19G, and 19B, together with the light-shielding layers 36, are covered as a whole with a covering substrate 20.

The display unit 100 described above may be used for monochrome display or color display. Color display can be available when appropriate light-emitting materials are chosen for the light-emitting elements 1R, 1G, and 1B, Thanks to such a light-emitting apparatus as described above, displays like the display unit 100 (displays according to an aspect of the present invention) have excellent reliability.

Figure 4:
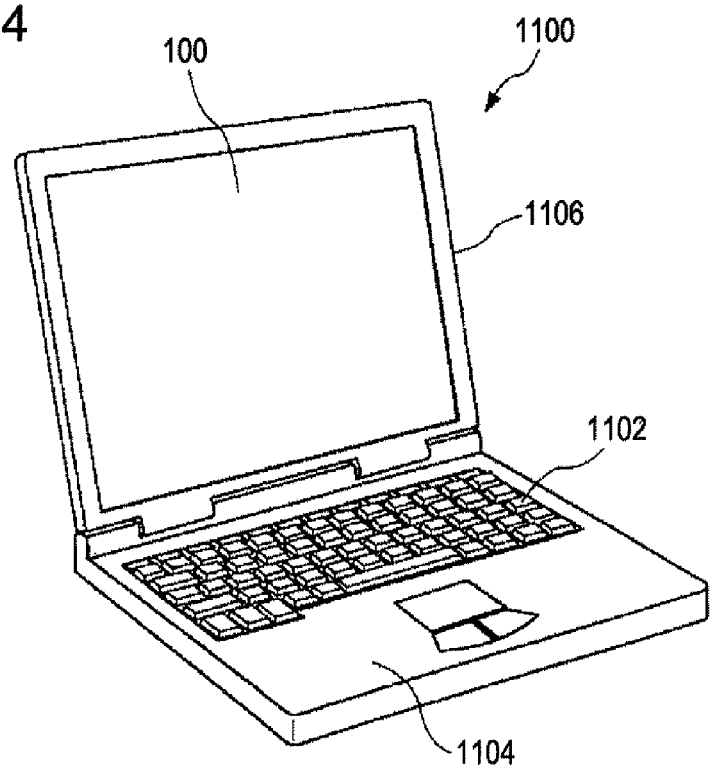
FIG. 4 is a perspective view of a mobile (notebook) PC to which an electronic device according to an aspect of the invention is applied.

FIG. 4 is a perspective view of a mobile (notebook) PC to which an electronic device according to an aspect of the invention is applied.

FIG. 4 illustrates a personal computer 1100, which has a body 1104 and a display assembly 1106. The body 1104 has a keyboard 1102, and the display assembly 1106 has a display portion. The display assembly 1106 is hinge-mounted to the body 1104. In this personal computer 1100, the display portion of the display assembly 1106 contains the display unit 100 described above.

Figure 5:
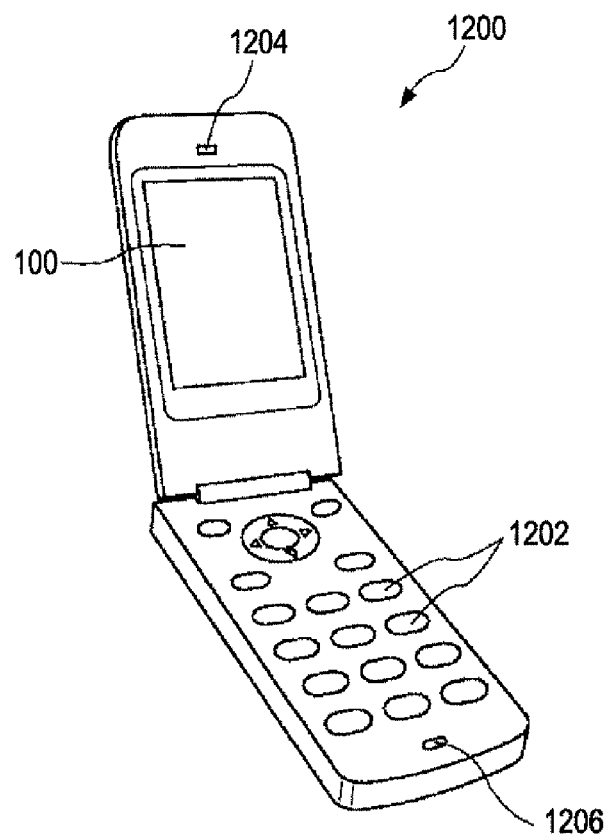
FIG. 5 is a perspective view of a cellular phone (or any other type of personal communicating device) to which an electronic device according to an aspect of the invention is applied.

FIG. 5 is a perspective view of a cellular phone (or any other type of personal communicating device) to which an electronic device according to an aspect of the invention is applied.

FIG. 5 illustrates a cellular phone 1200, which has buttons 1202, a speaker 1204, a microphone 1206, and a display portion. In this cellular phone 1200, the display portion has the display unit 100 described above.

Figure 6:
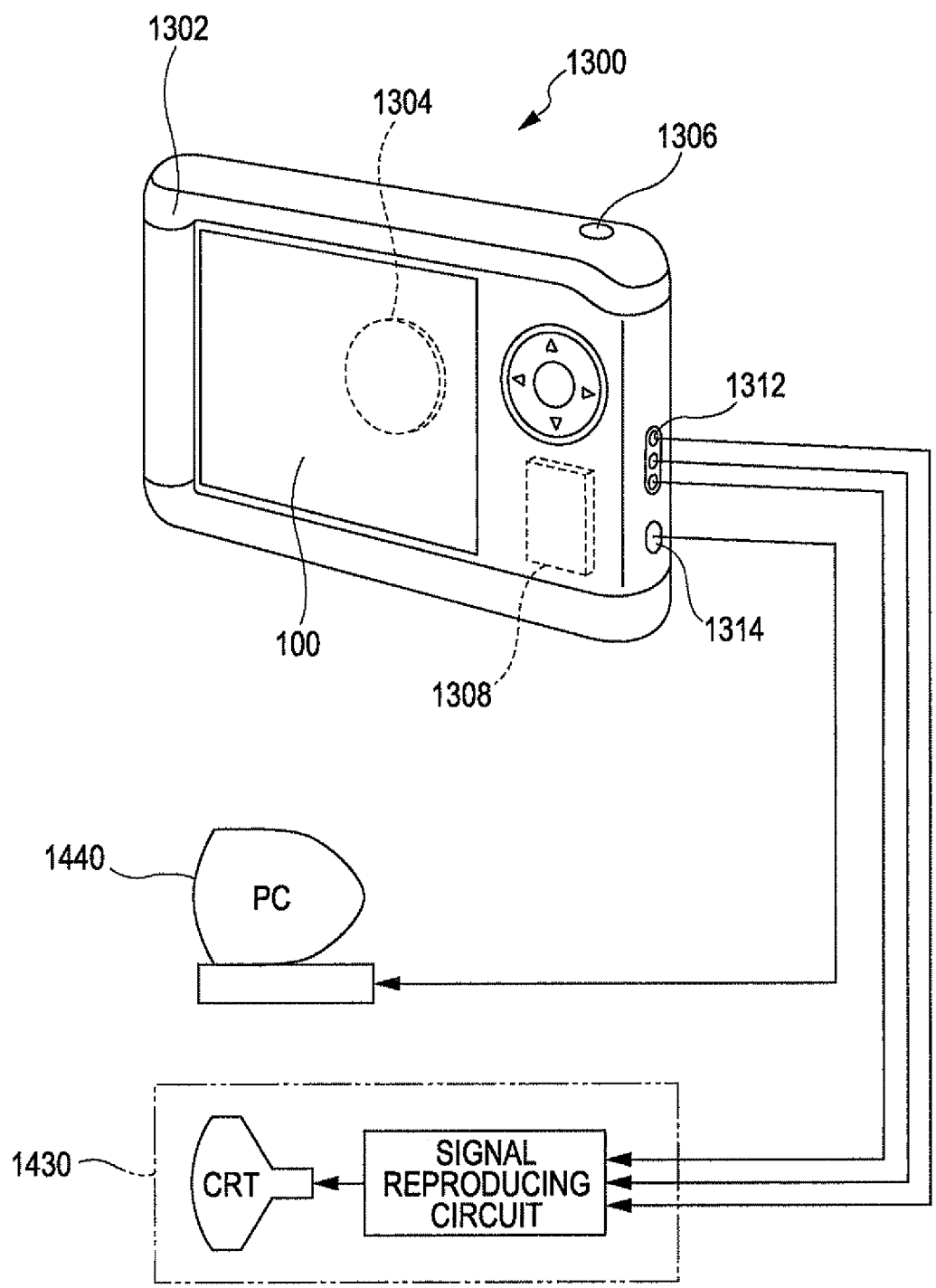
FIG. 6 is a perspective view of a digital still camera to which an electronic device according to an aspect of the invention is applied.

FIG. 6 is a perspective view of a digital still camera to which an electronic device according to an aspect of the invention is applied, including a simplified diagram of connections to related devices.

In contrast to film cameras, in which a film is exposed to photographic images of objects, digital still cameras, including the digital still camera 1300 illustrated in FIG. 6, generate image signals by photoelectric conversion of photographic images of objects using a CCD (a charge-coupled device) or some other kind of imaging element.

The digital still camera 1300 has a frame (body) 1302, which has a display portion on its back so that images generated from image signals given by a CCD can be displayed. In other words, the display portion serves as a viewfinder that displays objects in the form of electronic images. In this digital still camera 1300, the display portion has the display unit 100 described above.

There is a substrate 1308 inside the frame 1302, and the substrate 1308 carries memories for storage of image signals. On the front, the frame 1302 has a photoreceptor unit 1304 that contains lenses (an optical system), a CCD, and other related components.

A user presses a release button 1306 while viewing the image of an object on the display portion, and at the same time an image signal is generated by the CCD and then transferred to and stored in the memories on the substrate 1308.

The frame 1302 additionally has a video output terminal 1312 and a data communication interface 1314 arranged on its one of the lateral sides. As illustrated in the drawing, the video output terminal 1312 and the data communication interface 1314 can be used for connection with a television 1430 and a personal computer 1440, respectively. Under this constitution, predetermined operations allow image signals stored in the memories on the substrate 1308 to be output to the television 1430 and/or the personal computer 1440.

The application of the electronic device according to an aspect of the invention is never limited to those mentioned above, namely, (mobile) PCs like the one illustrated in FIG. 4, cellular phones like the one illustrated in FIG. 5, or digital still cameras like the one illustrated in FIG. 6. Other examples of possible applications include the following: televisions, video cameras, viewfinder-based or direct-viewing video cassette recorders, laptops, car navigation systems, pagers, PDAs (including ones with communication capability), electronic dictionaries, calculators, gaming hardware, word processors, work stations, videophones, security monitors, electronic binoculars, POS terminals, equipment with touch screens (e.g., ATMs and ticket machines), medical devices (e.g., electronic thermometers, manometers, blood glucose analyzers, electrocardiograph, ultrasonograph, and endoscopic monitors), fishfinders, kinds of measurement systems, kinds of gauging instruments (e.g., ones for automobiles, airplanes, and ships), flight simulators, kinds of monitors, kinds of projectors, and so forth.

Note that the foregoing description and referenced drawings on light-emitting elements, light-emitting apparatuses, displays, and electronic devices according to some aspects of the invention are never intended to limit any aspect of the invention. For example, the light-emitting element described above as having one or three light-emitting layers may have two, four, or more light-emitting layers. With any number of light-emitting layers, the light-emitting element can offer its advantages described above as long as its hole-injection layer is composed mainly of benzidine derivative(s) and interposed between and in direct contact with a cathode and a light-emitting layer. Also, the combination of colors for light-emitting layers is never limited the one described above, namely, the combination of red, green, and blue.

The following describes some specific examples of an aspect of the invention.

1. Preparation of a Light-Emitting Element

Example 1

I. A transparent glass substrate with an average thickness of 0.5 mm is coated by sputtering with an ITO electrode with an average thickness of 150 nm. This ITO electrode was for the use as a cathode. Subsequently, the substrate was sonicated in acetone and in 2-propanol and then treated with oxygen plasma and argon plasma. The conditions for plasma treatment were as follows regardless of sprayed element: substrate temperature: 70 to 90° C.; plasma power: 100 W; gas flow rate: 20 sccm; treatment duration: 5 seconds.

II. The ITO electrode was coated by vacuum deposition with the benzidine derivative expressed by Formula (4-3) until a film was obtained with an average thickness of 60 nm. The obtained film was for the use as a hole-injection layer.

III. The hole-injection layer was coated by vacuum deposition with materials of a red light-emitting layer (a first light-emitting layer) until a film was obtained with an average thickness of 7 nm. The materials used were the tetraaryldiindenoperylene expressed by Formula (61-1) as red light-emitting material (guest material) and the naphthacene derivative expressed by Formula (61a-2) as host material. The content ratio or doping amount of the red light-emitting material as dopant was set at 1.0 wt % with respect to the red light-emitting layer.

IV. The red light-emitting layer was coated by vacuum deposition with materials of an intermediate layer until a film was obtained with an average thickness of 20 nm. The materials used were the compound expressed by Formula (62-1) and the anthracene derivative expressed by Formula (61a-1).

The mixing ratio (w/w) was set at 1/1.

V. The intermediate layer was coated by vacuum deposition with materials of a blue light-emitting layer (a second light-emitting layer) until a film was obtained with an average thickness of 20 nm. The materials used were the compound expressed by Formula (63-1) as blue light-emitting material (guest material) and the anthracene derivative expressed by Formula (61a-1) as host material. The content ratio or doping amount of the blue light-emitting material as dopant was set at 6.0 wt % with respect to the blue light-emitting layer.

VI. The blue light-emitting layer was coated by vacuum deposition with the anthracene derivative expressed by Formula (61a-1), the material of a green light-emitting layer (a third light-emitting layer), until a film was obtained with an average thickness of 20 nm.

VII. The green light-emitting layer was coated by vacuum deposition with the compound expressed by Formula (7-1), tris(8-quinolinolate)aluminum ($Alq_3$), until a film was obtained with an average thickness of 15 nm. The obtained film was for the use as an electron-transport layer.

VIII. The electron-transport layer was coated by vacuum deposition with lithium fluoride (LiF) until a film was obtained with an average thickness of 1 nm. The obtained film was for the use as an electron-injection layer.

IX. The electron-injection layer was coated by vacuum deposition with aluminum (Al) until a film was obtained with an average thickness of 150 nm. The obtained film was for the use as a cathode.

X. The formed layers were covered as a whole with a glass cover, and the gap between the substrate and the cover was sealed with an epoxy resin sealant. In this way, a light-emitting element like the one illustrated in FIG. 1 was prepared with the capability of emitting white light.

Example 2

A light-emitting element was prepared in the same way as in Example 1 except that the hole-injection layer had an average thickness of 80 nm.

Example 3

A light-emitting element was prepared in the same way as in Example 1 except that the hole-injection layer had an average thickness of 100 nm.

Example 4

A light-emitting element was prepared in the same way as in Example 1 except that the hole-injection layer had an average thickness of 200 nm.

Example 5

A light-emitting element was prepared in the same way as in Example 1 except that the hole-injection layer had an average thickness of 250 nm.

Comparative Example 1

A light-emitting element was prepared in the same way as in Example 1 except for the following differences: The hole-injection layer had an average thickness of 40 nm, the amine-based compound expressed by Formula (4a-4), and a hole-transport layer was added. As for the hole-transport layer, it was formed after the hole-injection layer and before the red light-emitting layer, the material used was the benzidine derivative expressed by Formula (4-3), the film formation method was vacuum deposition, and the average thickness was 20 nm.

Comparative Example 2

A light-emitting element was prepared in the same way as in Comparative Example 1 except that the hole-injection layer had an average thickness of 50 nm and that the hole-transport layer had an average thickness of 30 nm.

Comparative Example 3

A light-emitting element was prepared in the same way as in Comparative Example 1 except that the hole-injection layer had an average thickness of 70 nm and that the hole-transport layer had an average thickness of 30 nm.

Comparative Example 4

A light-emitting element was prepared in the same way as in Comparative Example 1 except that the hole-injection layer had an average thickness of 100 nm and that the hole-transport layer had an average thickness of 50 nm.

2. Evaluation

In accordance with Examples 1 to 5 and Comparative Examples 1 to 4, twenty light-emitting elements were prepared per example or comparative example. Each set of light-emitting elements was connected to a direct-current power supply and then run with a constant current that gave a brightness of 2000 $cd/m^2$. Under this situation, the driving voltage (v) was measured, and the percentage of elements that successfully emitted light was recorded as yield (%).

Figure 7:
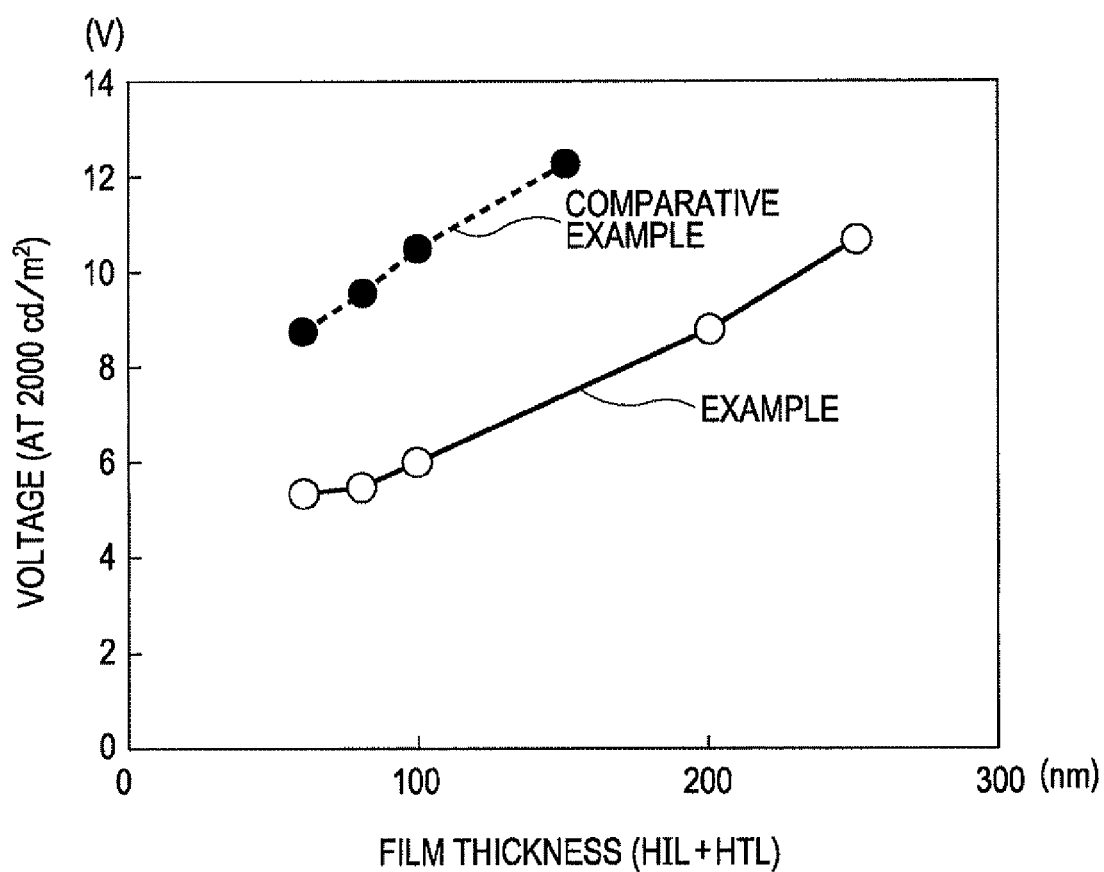
FIG. 7 is a plot of the total thickness of the hole-injection and hole-transport layers of a light-emitting element versus a driving voltage required to operate it for an example and a comparative example of the invention.

Table 1 summarizes the results obtained. Also, FIG. 7 is a plot of the total thickness of the hole-injection layer (HIL) and the hole-transport layer (HTL), in other words, the average distance between the cathode and the red light-emitting layer, versus the driving voltage.

TABLE 1

| | Driving voltage (V) at 2000 $cd/m^2$ | Yield (%) |
|---|---|---|
| Example 1 | 5.3 | 60 |
| Example 2 | 5.5 | 70 |
| Example 3 | 6.0 | 75 |
| Example 4 | 8.8 | 80 |
| Example 5 | 10.7 | 80 |
| Comparative Example 1 | 8.7 | 50 |
| Comparative Example 2 | 9.5 | 65 |
| Comparative Example 3 | 10.5 | No light emission |
| Comparative Example 4 | 12.3 | No light emission |

Although the sets of light-emitting element according to Examples 1 to 4 were equivalent to those according to Comparative Examples 1 to 4 in terms of the average distance between the cathode and the red light-emitting layer, clear differences between them can be seen from Table 1; Examples 1 to 4 provided better results than their comparative examples both in driving voltage requirement and production yield. Also, FIG. 7 demonstrates that Examples 1 to 5 featured a significantly decreased driving voltage requirement.

In particular, Examples 2 and 3 were superior to all of Comparative Examples 1 to 4 both in driving voltage requirement and production yield. In other words, Examples 2 and 3 allowed light-emitting elements to be produced with a dramatically decreased driving voltage requirement and a good yield.

The entire disclosure of Japanese Patent Application No. 2009-263407, filed Nov. 18, 2009 is expressly incorporated by reference herein.

What is claimed is:

1. A light-emitting element comprising:
   a cathode;
   an anode;
   a light-emitting portion interposed between the cathode and the anode and having a light-emitting layer that emits light on energization between the cathode and the anode; and
   a hole-injection layer interposed between and in direct contact with the anode and the light-emitting layer and having a capability of receiving holes, wherein:
   the hole-injection layer is mainly composed of a benzidine derivative, and the hole-injection layer has an average thickness in the range of 80 nm to 200 nm.

2. The light-emitting element according to claim 1, wherein the distance between the anode and the cathode is in the range of 150 nm to 300 nm.

3. The light-emitting element according to claim 1, wherein the anode has the surface thereof on the hole-injection layer side treated with plasma.

4. The light-emitting element according to claim 1, wherein the anode is composed of indium tin oxide.

5. The light-emitting element according to claim 1, wherein:
   the light-emitting portion has several light-emitting layers; and
   the hole-injection layer is interposed between and in direct contact with the anode and the closest light-emitting layer to the anode.

6. The light-emitting element according to claim 5, wherein:
   the light-emitting portion contains first, second, and third light-emitting layers for emission of light in different colors, layered in this order from the side of the anode to the side of the cathode; and
   the hole-injection layer is interposed between and in direct contact with the anode and the first light-emitting layer.

7. The light-emitting element according to claim 6, wherein the first light-emitting layer contains an acene compound.

8. The light-emitting element according to claim 7, wherein the acene compound is a naphthacene derivative.

9. The light-emitting element according to claim 7, wherein the content ratio of the acene compound in the first light-emitting layer is in the range of 90 wt % to 99.99 wt %.

10. The light-emitting element according to claim 6, wherein the light-emitting portion has an intermediate layer interposed between the first and second light-emitting layers.

11. The light-emitting element according to claim 6, wherein the first light-emitting layer emits red light on energization between the cathode and the anode, and the second and third light-emitting layers emit blue and green light or vice versa on energization between the cathode and the anode.

12. The light-emitting element according to claim 1, wherein the benzidine derivative has a content ratio in the range of 50 wt % to 100 wt % with respect to the hole-injection layer.

13. A light-emitting apparatus comprising the light-emitting element according to claim 1.

14. A display comprising the light-emitting apparatus according to claim 13.

15. An electronic device comprising the display according to claim 14.

16. A light-emitting element comprising:
    a cathode;
    an anode;
    a light-emitting portion inserted between the cathode and the anode and having a light-emitting layer that emits light on energization between the cathode and the anode; and
    a hole-injection layer sandwiched between and in direct contact with the anode and the light-emitting layer and having a capability of receiving holes, wherein:
    the hole-injection layer is mainly composed of a benzidine derivative, and
    the distance between the anode and the cathode is in the range of 150 nm to 300 nm.

17. The light-emitting element according to claim 16, wherein the benzidine derivative has a content ratio in the range of 50 wt % to 100 wt % with respect to the hole-injection layer.

18. A light-emitting element comprising:
    a cathode;
    an anode;
    a light-emitting portion inserted between the cathode and the anode and having a light-emitting layer that emits light on energization between the cathode and the anode; and
    a hole-injection layer sandwiched between and in direct contact with the anode and the light-emitting layer and having a capability of receiving holes, wherein:
    the hole-injection layer is mainly composed of a benzidine derivative,
    the light-emitting portion contains first, second, and third light-emitting layers for emission of light in different colors, layered in this order from the side of the anode to the side of the cathode; and
    the hole-injection layer is interposed between and in direct contact with the anode and the first light-emitting layer.

19. The light-emitting element according to claim 18, wherein the benzidine derivative has a content ratio in the range of 50 wt % to 100 wt % with respect to the hole-injection layer.

* * * * *